(12) United States Patent
Tamai et al.

(10) Patent No.: US 12,424,507 B2
(45) Date of Patent: Sep. 23, 2025

(54) COOLING APPARATUS AND SEMICONDUCTOR MODULE

(71) Applicant: FUJI ELECTRIC CO., LTD., Kanagawa (JP)

(72) Inventors: Yuta Tamai, Matsumoto (JP); Takahiro Koyama, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 565 days.

(21) Appl. No.: 17/747,994

(22) Filed: May 18, 2022

(65) Prior Publication Data

US 2022/0278014 A1 Sep. 1, 2022

Related U.S. Application Data

(63) Continuation of application No. PCT/JP2021/016327, filed on Apr. 22, 2021.

(30) Foreign Application Priority Data

Jun. 17, 2020 (JP) ................................ 2020-104802

(51) Int. Cl.
*H01L 23/367* (2006.01)
(52) U.S. Cl.
CPC .................. *H01L 23/3672* (2013.01)
(58) Field of Classification Search
CPC ..... H05K 7/20; H05K 5/066; F28F 2275/045; B23K 1/0012; H01L 23/3672; H01L 23/10; H01L 21/4882
See application file for complete search history.

(56) References Cited

U.S. PATENT DOCUMENTS

| 10,192,807 B2* | 1/2019 | Koyama | ............... H01L 23/473 |
| 2014/0054023 A1* | 2/2014 | Kokubo | ............... B21K 23/00 72/352 |

(Continued)

FOREIGN PATENT DOCUMENTS

| CN | 109844441 A | 6/2019 |
| CN | 110534486 A | 12/2019 |

(Continued)

OTHER PUBLICATIONS

Al-Zaidi et al., Flow boiling of HFE-7100 in microchannels: Experimental study and comparison with correlations (Year: 2019).*

(Continued)

*Primary Examiner* — Nduka E Ojeh

(57) ABSTRACT

A cooling apparatus for a semiconductor module including a semiconductor chip includes a top plate having a lower surface a bottom plate disposed to have a refrigerant circulation portion between the bottom plate and the lower surface of the top plate and a side wall configured to surround the refrigerant circulation portion. The side wall includes a fixed portion fixed to the top plate or the bottom plate with a fixing material. The fixed portion includes an edge portion disposed to face the top plate or the bottom plate and a separated portion disposed to be adjacent to the edge portion in a first direction in which the refrigerant circulation portion and the side wall are aligned, the separated portion being disposed farther from the top plate or the bottom plate disposed to face the edge portion than the edge portion.

16 Claims, 9 Drawing Sheets

(56) References Cited

U.S. PATENT DOCUMENTS

| | | |
|---|---|---|
| 2016/0181221 A1 | 6/2016 | Sunaga |
| 2017/0263533 A1* | 9/2017 | Koyama ............. H01L 23/4006 |
| 2018/0128555 A1 | 5/2018 | Kinder |
| 2019/0279917 A1* | 9/2019 | Gohara ................... F28F 3/025 |
| 2019/0304874 A1* | 10/2019 | Arai ...................... H02M 7/003 |
| 2019/0363036 A1* | 11/2019 | Arai .................. H05K 7/20927 |
| 2020/0286813 A1* | 9/2020 | Yamada ................ H01L 23/473 |

FOREIGN PATENT DOCUMENTS

| | | | | |
|---|---|---|---|---|
| JP | H1158001 A | * | 3/1993 | |
| JP | 2006114571 A | | 4/2006 | |
| JP | 2007085793 A | | 4/2007 | |
| JP | 2010192708 A | * | 9/2010 | ......... H05K 7/20927 |
| JP | 2012104708 A | | 5/2012 | |
| JP | 2013024483 A | | 2/2013 | |
| JP | 2014011447 A | * | 1/2014 | |
| JP | 2014179563 A | | 9/2014 | |
| JP | 2016120526 A | | 7/2016 | |
| JP | 2018049861 A | * | 3/2018 | |
| JP | 2019160852 A | | 9/2019 | |
| JP | 2019186237 A | | 10/2019 | |
| JP | 2020092250 A | | 6/2020 | |
| JP | 6870253 B2 | * | 5/2021 | |
| WO | 2015059882 A1 | | 4/2015 | |
| WO | WO-2019145556 A1 | * | 8/2019 | ........... B23K 1/0012 |

OTHER PUBLICATIONS

Junhao Sun, Qi Yan, Zhuguo Li, Jian Huang, Effect of bevel angle on microstructure and mechanical property of Al/steel butt joint using laser welding-brazing method, Materials & Design, vol. 90, 2016, pp. 468-4777 (Year: 2016).*

Module 4—Welding Design, 2017, United States Nuclear Regulatory Commission, p. 139 (Year: 2017).*

Office Action issued for counterpart Chinese Application 202180006651. X, issued by The State Intellectual Property Office of People's Republic of China on Feb. 26, 2025.

International Search Report and (ISA/237) Written Opinion of the International Search Authority for International Patent Application No. PCT/JP2021/016327, mailed by the Japan Patent Office on Aug. 3, 2021.

Office Action issued for counterpart Japanese Application No. 2022-532347, issued by the Japanese Patent Office on Aug. 1, 2023 (drafted on Jul. 27, 2023).

* cited by examiner

COOLING APPARATUS AND SEMICONDUCTOR MODULE

The contents of the following Japanese patent applications are incorporated herein by reference:
NO. 2020-104802 filed in JP on Jun. 17, 2020, and
PCT/JP2021/016327 filed in WO on Apr. 22, 2021.

BACKGROUND

1. Technical Field

The present invention relates to a cooling apparatus and a semiconductor module.

2. Related Art

Conventionally, a configuration in which a cooling apparatus is provided in a semiconductor module including a semiconductor element such as a power semiconductor chip is known (see, for example, Patent Document 1).
Patent Document 1: Japanese Patent Application Publication No. 2014-179563

DESCRIPTION OF EXEMPLARY EMBODIMENTS

Hereinafter, the present invention will be described through embodiments of the invention, but the following embodiments do not limit the invention according to the claims. Not all combinations of features described in the embodiments are essential to the solution of the invention.

Figure 1:
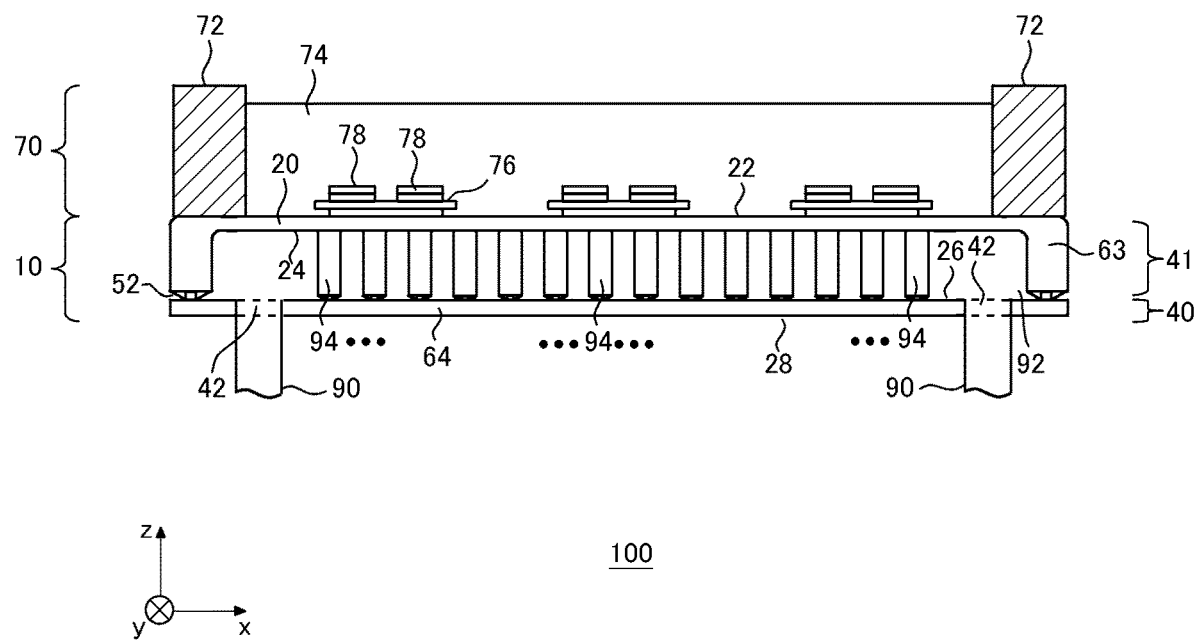
FIG. 1 is a schematic cross-sectional view illustrating an example of a semiconductor module 100 according to one embodiment of the present invention.

FIG. 1 is a schematic cross-sectional view illustrating an example of a semiconductor module 100 according to one embodiment of the present invention. The semiconductor module 100 includes a semiconductor device 70 and a cooling apparatus 10. The semiconductor device 70 of the present example is mounted on the cooling apparatus 10. In the present specification, a plane of the cooling apparatus 10 on which the semiconductor device 70 is mounted is defined as an xy plane, and a plane perpendicular to the xy plane is defined as a z axis. In the present specification, a direction from the cooling apparatus 10 toward the semiconductor device 70 in the z axis direction is referred to as "up", and the opposite direction is referred to as "down", but the up and down directions are not limited to the gravity direction. In the present specification, among the surfaces of each member, a surface on the upper side is referred to as an upper surface, and a surface on the lower side is referred to as a lower surface.

The semiconductor device 70 includes one or more semiconductor chips 78 such as power semiconductor chips. As an example, the semiconductor chip 78 is provided with an insulated gate bipolar transistor (IGBT) formed on a semiconductor substrate such as silicon.

The semiconductor device 70 includes a circuit board 76 and a housing portion 72. The circuit board 76, as an example, has a circuit pattern provided on one surface of an insulating substrate, and a heat sink provided on the other surface. The semiconductor chip 78 is fixed to the circuit board 76 via solder or the like. The housing portion 72 is formed of an insulating material such as resin. The housing portion 72 of the present example is a resin case formed of resin. The housing portion 72 has an internal space that houses the semiconductor chip 78, the circuit board 76, wiring, and the like. The internal space of the housing portion 72 may be filled with a sealing member 74 that seals the semiconductor chip 78, the circuit board 76, wiring, and the like. The sealing member 74 is, for example, an insulating member such as silicone gel or epoxy resin.

The cooling apparatus 10 is a cooling apparatus for the semiconductor module 100. The cooling apparatus 10 cools the semiconductor device 70. The cooling apparatus 10 has a ceiling portion 41 and a bottom portion 40. In the example of FIG. 1, the ceiling portion 41 includes a top plate 20, side walls 63, and cooling fins 94. The top plate 20 and the side wall 63 may be configured as an integrated member by plastically deforming one metal plate. The bottom portion 40 has a bottom plate 64. In another example, the ceiling portion 41 may have the top plate 20, and the bottom portion 40 may have the bottom plate 64, the side walls 63, and the cooling fins 94. In this case, the bottom plate 64 and the side wall 63 may be configured as an integrated member. The cooling fins 94 may be fixed to at least one of the bottom plate 64 and the top plate 20 with a brazing material or the like. The cooling fin 94 may be configured as a member integrated with the bottom plate 64 and the top plate 20 by casting or the like.

The top plate 20 may be a plate-like metal plate having an upper surface 22 and a lower surface 24 that are parallel to the xy plane. As an example, the top plate 20 is made of metal containing aluminum. The semiconductor device 70 is mounted on the upper surface 22 of the top plate 20. Heat generated by the semiconductor chip 78 is transferred to the top plate 20. For example, the circuit board 76, a metal plate, and a thermal conductive member such as solder are disposed between the top plate 20 and the semiconductor chip 78. The circuit board 76 may be directly fixed to the upper surface 22 of the top plate 20 by solder or the like. In this case, the housing portion 72 is provided to surround a region where the circuit board 76 and the like are disposed on the upper surface 22 of the top plate 20. In another example, the circuit board 76 may not have a heat sink, and the insulating layer of the circuit board 76 on the side opposite to the semiconductor chip 78 may be directly fixed to the upper surface 22 of the top plate 20.

The side wall 63 connects the top plate 20 and the bottom plate 64. That is, the ceiling portion 41 of the present example is connected to the bottom portion 40 at the side wall 63. The side wall 63 may be fixed to at least one of the top plate 20 and the bottom plate 64 in close contact by a brazing material. In the example of FIG. 1, since the ceiling portion 41 has the side wall 63, the side wall 63 is fixed to the bottom plate 64 by a brazing material. In another example, for example, when the bottom portion 40 has the side wall 63, the side wall 63 may be fixed to the top plate 20 by a brazing material. In still another example, the side wall 63 may be fixed to both the bottom plate 64 and the top plate 20 with a brazing material or the like.

The side wall 63 surrounds a refrigerant circulation portion 92 in the xy plane. In other words, the side wall 63 defines the refrigerant circulation portion 92 in the xy plane. The refrigerant circulation portion 92 is disposed on the lower surface 24 side of the top plate 20. The refrigerant circulation portion 92 is a region through which a refrigerant such as water circulates. The refrigerant circulation portion 92 may be a sealed space in contact with the lower surface 24 of the top plate 20. The bottom plate 64 is fixed to the side wall 63 surrounding the refrigerant circulation portion 92 in the xy plane in close contact by the brazing material. With this configuration, the refrigerant circulation portion 92 is sealed. The side wall 63 may be fixed to an upper surface 26 of the bottom plate 64 in close contact by a sealing material, an adhesive, or another member. The close contact refers to a state in which the refrigerant inside the refrigerant circulation portion 92 does not leak from the close contact portion.

The cooling fins 94 are disposed inside the refrigerant circulation portion 92. The cooling fins 94 may be fixed to at least one of the top plate 20 and the bottom plate 64 by a brazing material. In the example of FIG. 1, the cooling fins 94 are fixed to the bottom plate 64 by a brazing material. When the cooling fins 94 are fixed to one of the top plate 20 and the bottom plate 64 with a brazing material, the cooling fins 94 may be away from or in contact with the top plate 20 that is not brazed or the bottom plate 64. The cooling fins 94 may be formed integrally with one of the top plate 20 or the bottom plate 64, and may be brazed to the other of the top plate 20 or the bottom plate 64. Allowing the refrigerant to pass in the vicinity of the cooling fins 94 causes heat generated by the semiconductor chips 78 to be transferred to the refrigerant. This allows the semiconductor device 70 to be cooled.

The bottom portion 40 has the bottom plate 64. The bottom plate 64 is disposed to have a space functioning as the refrigerant circulation portion 92 between the bottom plate and the lower surface 24 of the top plate 20. The bottom plate 64 of the present example is provided with two or more openings 42 through which the refrigerant is introduced into or discharged from the refrigerant circulation portion 92. A pipe 90 for conveying the refrigerant is connected to the opening 42. The pipe 90 protrudes toward a lower surface 28 side of the cooling fins 94 (in the present example, the negative side on the z axis) with respect to the bottom plate 64.

In the present example, the side wall 63 and the bottom plate 64 are brazed to each other. As an example, the top plate 20, the side walls 63, and the bottom plate 64 are formed of metal having the same composition, and the brazing material is formed of metal having a melting point lower than that of the top plate 20 and the like. As the metal, a metal containing aluminum may be used. As the metal containing aluminum, an aluminum alloy such as an Al—Mn-based alloy (3000 series aluminum alloy) or an Al—Mg—Si-based alloy (6000 series aluminum alloy) may be used. As the brazing material, an aluminum alloy such as an Al—Si-based alloy (4000 series aluminum alloy) may be used. The aluminum alloy used in the present example preferably has a proof stress of 35 to 65 MPa at room temperature. The proof stress is a stress that causes a permanent strain of 0.2% when unloaded.

The side wall 63 has a fixed portion 52. The side wall 63 has the fixed portion 52 at its edge. The edge of the side wall 63 is a portion of the side wall 63 closest to the bottom plate 64 or the top plate 20. In the example of FIG. 1, the end portion of the side wall 63 in the z axis direction is defined as the edge. The side wall 63 has the fixed portion 52 with respect to at least one of the top plate 20 and the bottom plate 64. The fixed portion 52 may be fixed to the top plate 20 or the bottom plate 64 by a brazing material. In the example of FIG. 1, the fixed portion 52 is in close contact with the bottom plate 64 by a brazing material.

When the two flat members are fixed with a fixing material such as a brazing material, the fixing material before solidification flows from the region between the two members to the outside. For this reason, the amount of the fixing material remaining between the two members is reduced. The reduction in the amount of the fixing material causes voids, which causes the refrigerant inside the refrigerant circulation portion 92 to leak from between the side wall 63 and the bottom plate 64. Therefore, the sealing performance of the cooling apparatus 10 deteriorates.

In the present example, the fixed portion 52 has an edge portion and a separated portion. The edge portion in the present example is a portion of the side wall 63 closest to the bottom plate 64. The edge portion may be a plane parallel to the bottom plate 64 or may be an apex disposed to face the bottom plate 64. The separated portion is a portion that is adjacent to the edge portion and whose distance from the bottom plate 64 is larger than a distance between the edge portion and the bottom plate 64. Note that the separated portion is provided at a position facing the bottom plate 64 in the z axis direction. That is, a relatively large space is provided between the separated portion and the bottom plate 64. In the example of FIG. 1, the fixed portion 52 has a tapered shape. When the fixed portion 52 and the bottom plate 64 are brazed, the brazing material between the edge portion and the bottom plate 64 flows into the space between the separated portion and the bottom plate 64. As a result, the brazing material flowing out from between the edge portion and the bottom plate 64 can also contribute to the close contact fixation between the side wall 63 and the bottom plate 64. A layer of brazing materials that is thick in the z axis direction can be formed between the separated portion and the bottom plate 64. Therefore, the sealing performance of the cooling apparatus 10 can be improved.

Figure 2:
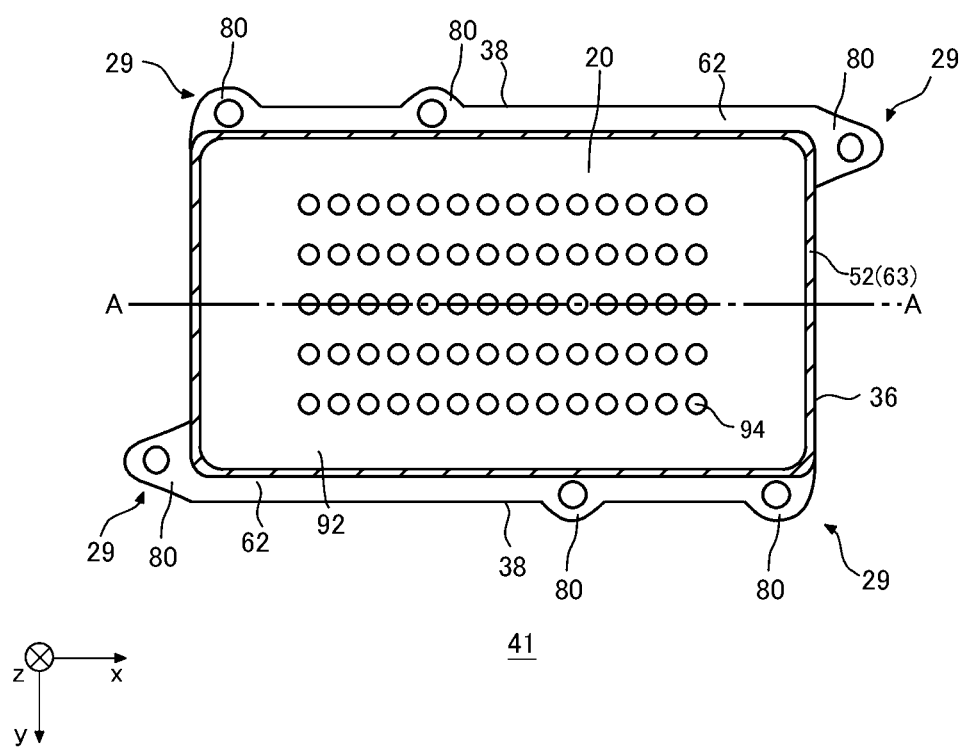
FIG. 2 is a diagram illustrating an example of a shape of a ceiling portion 41 in a bottom view (xy plane).

FIG. 2 is a diagram illustrating an example of the shape of the ceiling portion 41 in a bottom view (xy plane). In the present specification, viewing from the lower surface side of the top plate 20 and the like is referred to as a bottom view, and viewing from the upper surface side is referred to as a top view. The drawings in a bottom view and a top view are views obtained by projecting the position of each member on the xy plane. The ceiling portion 41 in FIG. 1 corresponds to the cross section A-A in FIG. 2. Note that, in FIG. 1, the width of the side wall 63 is illustrated to be large in order to describe the side wall 63. In FIG. 1 and FIG. 2, the sizes of the members do not necessarily coincide with each other.

The ceiling portion 41 of the present example includes the top plate 20, the fixed portion 52 (side wall 63), the cooling fins 94, and an outer edge portion 62 in a bottom view. The ceiling portion 41 has two sets of facing sides 36 and 38 in a top view. The ceiling portion 41 of the present example has a substantially rectangular shape having a shorter side 36 and a longer side 38. The ceiling portion 41 has four corner portions 29. In the present specification, a direction in which the shorter side 36 extends is defined as a y axis, and a direction in which the longer side 38 extends is defined as an x axis. The side wall 63 in the present example is substantially perpendicular to the xy plane.

The outer edge portion 62 is provided on the outer edge of the ceiling portion 41. The outer edge portion 62 of the present example is a region outside the side wall 63 in the top plate 20. The outer edge portion 62 is provided outside the refrigerant circulation portion 92 surrounded by the side wall 63. The outer edge portion 62 may be provided so as to surround at least a part of the periphery of the side wall 63. In the example of FIG. 2, the outer edge portion 62 surrounds the side wall 63 in the y axis direction. The outer edge portion 62 may be provided so as to surround the entire periphery of the side wall 63.

The outer edge portion 62 has a fastening portion 80. The fastening portion 80 fastens the ceiling portion 41 and the bottom portion 40. The bottom portion 40 may also have a fastening portion. The fastening portion 80 may be used to fix the semiconductor module 100 to an external apparatus. As an example, the fastening portion 80 is a region in which the top plate 20 and the bottom plate 64 are disposed to overlap each other in the z axis direction in direct or indirect close contact and in which a through hole penetrating the top plate 20 and the bottom portion 40 is formed.

The top plate 20 is provided with a plurality of fastening portions 80. At least one fastening portion 80 may be provided at the corner portion 29. In the present example, the fastening portion 80 is provided at all of the corner portions 29. The fastening portion 80 may or may not be provided on each longer side 38. The fastening portion 80 may or may not be provided on each shorter side 36.

The cooling fins 94 are disposed inside the refrigerant circulation portion 92 surrounded by the side walls 63. A plurality of cooling fins 94 may be evenly arranged in the x axis direction. A plurality of cooling fins 94 may be evenly arranged in the y axis direction. In other examples, the cooling fins 94 may be unevenly disposed in each direction.

Figure 3:
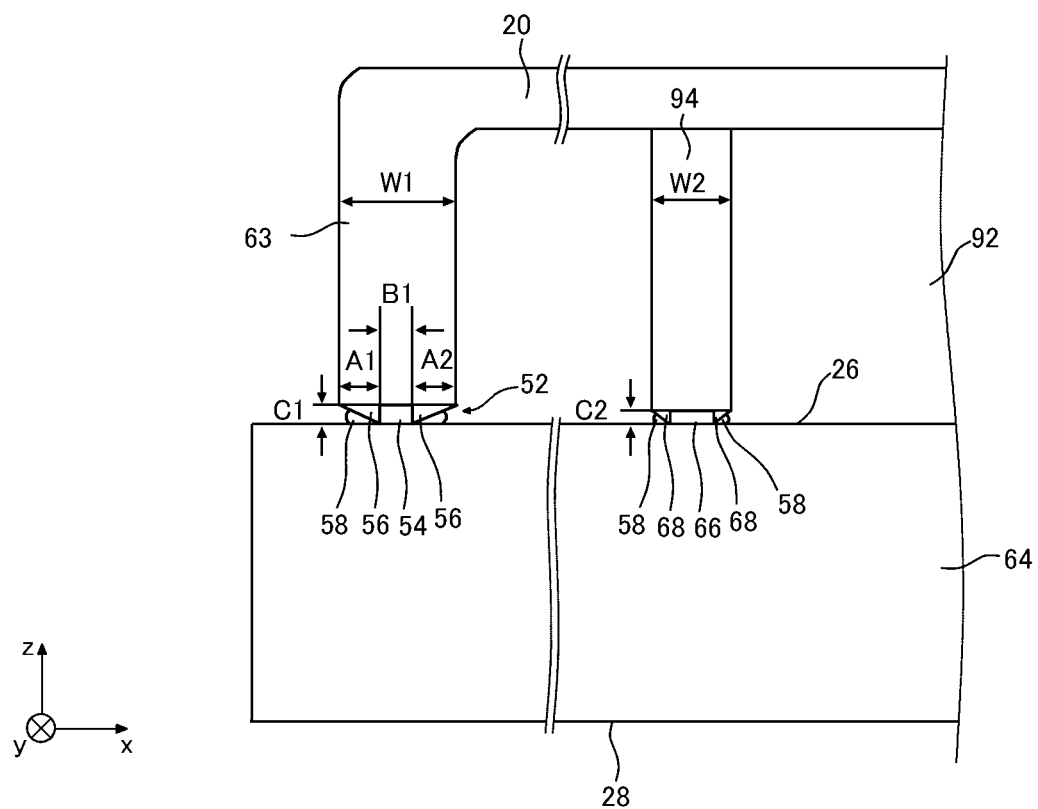
FIG. 3 is a diagram illustrating an example of a fixed portion 52 and a cooling fin 94 in the vicinity of the fixed portion 52 in a cooling apparatus 10.

FIG. 3 is a diagram illustrating an example of the fixed portion 52 and the cooling fin 94 in the vicinity of the fixed portion 52 in the cooling apparatus 10. FIG. 3 illustrates the fixed portion 52 and the cooling fin 94 closest to the fixed portion 52. In FIG. 3, a part of the top plate 20 and a part of the bottom plate 64 are also illustrated.

The fixed portion 52 has an edge portion 54. The edge portion 54 may be disposed to face the top plate 20 or the bottom plate 64. In the example of FIG. 3, the edge portion 54 is disposed to face the bottom plate 64. The edge portion 54 may be disposed in direct contact with the bottom plate 64.

The fixed portion 52 has a separated portion 56. The separated portion 56 is adjacent to the edge portion 54 in a first direction (the x axis direction in FIG. 3) in which the refrigerant circulation portion 92 and the side wall 63 are aligned. Note that, in the yz cross section, since the refrigerant circulation portion 92 and the side wall 63 are aligned in the y axis direction, the y axis direction is the first direction. The separated portion 56 may be disposed farther from the top plate 20 or the bottom plate 64 disposed to face the edge portion 54 than the edge portion 54. In the present example, the distance between the separated portion 56 and the bottom plate 64 is larger than the distance between the edge portion 54 and the bottom plate 64. The separated portion 56 may have an inclined surface inclined with respect to the z axis. That is, the distance between the separated portion 56 and the bottom plate 64 may increase as the separated portion separates from the edge portion 54 in the first direction. The slope of the inclination of the separated portion 56 may be even or may be uneven.

A brazing material 58 is disposed between the fixed portion 52 and the bottom plate 64. The brazing material 58 may be disposed between the separated portion 56 and the bottom plate 64. The brazing material 58 may also be disposed between the edge portion 54 and the bottom plate 64. The fixed portion 52 is brazed to the bottom plate 64 by the brazing material 58. Since the fixed portion 52 includes the edge portion 54 and the separated portion 56, the sealing performance of the cooling apparatus 10 can be improved as described above.

Note that the ceiling portion 41, the bottom portion 40, and particularly the separated portion 56 may be a forged product. By forming these by forging, a tapered shape can be easily formed. For example, the separated portion 56 of the fixed portion 52 can be formed by plastically deforming the corner of the metal plate by hitting the corner with a tool.

The fixed portion 52 may have a plurality of separated portions 56. In the example of FIG. 3, the fixed portion 52 has two separated portions 56. The edge portion 54 may be sandwiched between the plurality of separated portions 56 in the first direction (the x axis direction in FIG. 3). That is, the surface of the fixed portion 52 facing the bottom plate 64 may have a convex shape. With the two separated portions 56, the thick film brazing material 58 can be formed on both sides of the edge portion 54, so that the sealing performance can be improved.

Note that the fixed portion 52 may have a plurality of edge portions 54, and the separated portion 56 may be sandwiched between the plurality of edge portions 54. That is, the surface of the fixed portion 52 facing the bottom plate 64 may have a concave shape. Also with such a shape, the sealing performance of the cooling apparatus 10 can be improved.

The edge of the cooling fin 94 may have a tapered shape. That is, the edge of the cooling fin 94 may have an edge portion 66 and a separated portion 68. The edge portion 66 may have the same structure as the edge portion 54, and the separated portion 68 may have the same structure as the separated portion 56. However, in the cooling fin 94, the separated portion 68 may be disposed to surround the edge portion 66 in a top view. The edge portion 66 is disposed to face the bottom plate 64. The separated portion 68 is disposed farther from the bottom plate 64 than the edge portion 66. As a result, also in the cooling fin 94, a space through which the brazing material flows can be secured between the separated portion 68 and the bottom plate 64, and the bonding property can be secured. In the cooling fin 94, a width W1 of the side wall 63 may be smaller than a width W2 of the cooling fin 94. Note that, when the width W2 of the cooling fin 94 is not uniformly determined depending on the measurement direction, the measurement value in the smallest direction may be set as the width W2. Note that the edge of the cooling fin 94 may not have a tapered shape.

The brazing material 58 may be disposed between the edge of the cooling fin 94 and the bottom plate 64. That is, the brazing material 58 may be disposed between the edge portion 66 and the bottom plate 64 or between the separated portion 68 and the bottom plate 64. The edge of the cooling fin 94 is brazed to the bottom plate 64 by the brazing material 58.

A maximum separation distance C2 between the edge of the cooling fin 94 and the upper surface 26 of the bottom plate 64 may be smaller than a maximum separation distance C1 between the separated portion 56 and the upper surface 26 of the bottom plate 64. The maximum separation distance C2 between the edge of the cooling fin 94 and the upper surface 26 of the bottom plate 64 may be a distance between the end portion of the cooling fin 94 and the upper surface 26 of the bottom plate 64 in the first direction. The maximum separation distance C1 between the separated portion 56 and the upper surface 26 of the bottom plate 64 may be a distance between the end portion of the separated portion 56 and the upper surface 26 of the bottom plate 64 in the first direction. By setting the maximum separation distance C2 between the edge of the cooling fin 94 and the upper surface 26 of the bottom plate 64 to be smaller than the maximum separation distance C1 between the separated portion 56 and the upper surface 26 of the bottom plate 64, it is possible to ensure bonding property or load resistance also in the cooling fin 94 while improving the sealing performance of the cooling apparatus 10.

A width B1 of the edge portion 54 in the first direction (the x axis direction in FIG. 3) may be smaller than the sum of the respective widths of the plurality of separated portions 56 in the first direction. In the present example, the width B1 of the edge portion 54 may be smaller than the sum of a width A1 and a width A2 in the first direction of the two separated portions 56 sandwiching the edge portion 54 in the first direction. With such a configuration, a ratio of the separated portion 56 to the edge portion 54 in the fixed portion 52 can be increased. Therefore, the sealing performance of the cooling apparatus 10 can be improved.

The width B1 of the edge portion 54 in the first direction may be smaller than the width of each of the plurality of separated portions 56 in the first direction. That is, the width B1 of the edge portion 54 may be smaller than both the width A1 and the width A2 of the two separated portions 56 sandwiching the edge portion 54 in the first direction. With such a configuration, the ratio of the separated portion 56 to the edge portion 54 in the fixed portion 52 can be further increased. Note that the load resistance of the side wall 63 can be secured by providing the width B1 of the edge portion 54.

The widths A1 and A2 of the separated portions 56 in the first direction may be each 0.5 mm or more, and preferably 0.65 mm or more. The widths A1 and A2 of the separated portions 56 in the first direction may be each 1.0 mm or less, and preferably 0.85 mm or less. The width B1 of the edge portion 54 in the first direction may be 1.0 mm or less, and preferably 0.5 mm or less.

The width W1 of the side wall 63 in the first direction is the sum of the widths A1 and A2 of the separated portions 56 in the first direction and the width B1 of the edge portion 54 in the first direction (x axis direction). The width W1 of the side wall 63 is 2.0 mm as an example. The width B1 of the edge portion 54 in the first direction may be one-fourth or less of the width W1 of the side wall in the first direction. By setting the width B1 of the edge portion 54 in the first direction to one-fourth or less of the width W1 of the side wall in the first direction, the ratio of the separated portion 56 to the edge portion 54 in the fixed portion 52 can be increased. Note that, when the fixed portion 52 has a tapered shape, the width B1 of the edge portion 54 may be 1/10 or more of the width W1 of the side wall 63.

The maximum separation distance C1 may be smaller than the width of each of the plurality of separated portions 56 in the first direction. That is, the maximum separation distance C1 may be smaller than both the width A1 and the width A2 of the two separated portions 56 sandwiching the edge portion 54 in the first direction. The maximum separation distance C1 may be 0.1 mm or more, and preferably 0.2 mm or more. The maximum separation distance C1 may be 1.0 mm or less, and preferably 0.5 mm or less. With such a configuration, it is possible to prevent the separated portions 56 and the upper surface 26 of the bottom plate 64 from being excessively separated from each other to deteriorate bonding property.

The maximum separation distance C2 may be 0.0 mm or more. The case where the maximum separation distance C2 is 0.0 mm means a case where the edge of the cooling fin 94 does not have a tapered shape. The maximum separation distance C2 may be 0.2 mm or less. The maximum separation distance C2 is 0.1 mm as an example.

Figure 4:
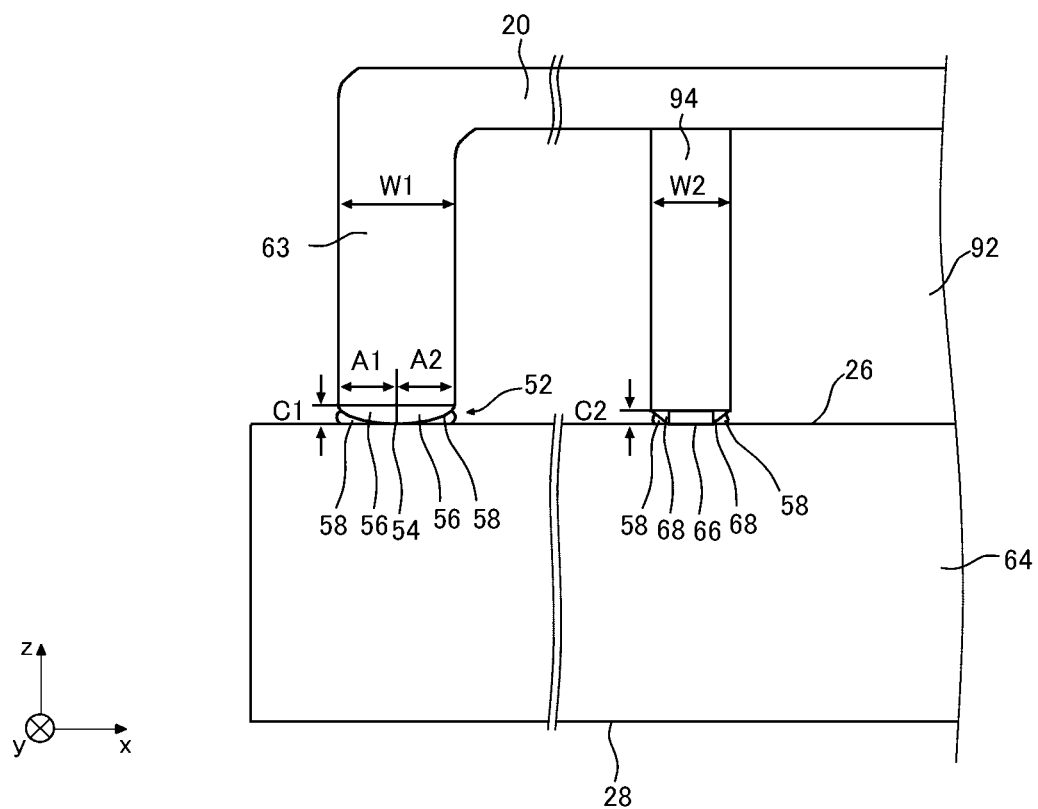
FIG. 4 is a diagram illustrating another example of the fixed portion 52 and the cooling fin 94 in the vicinity of the fixed portion 52 in the cooling apparatus 10.

FIG. 4 is a diagram illustrating another example of the fixed portion 52 and the cooling fin 94 in the vicinity of the fixed portion 52 in the cooling apparatus 10. The cooling apparatus 10 of FIG. 4 is different from the cooling apparatus 10 of FIG. 3 in that the fixed portion 52 has an arc shape in a predetermined cross section. The fixed portion 52 of the present example has an arc shape protruding toward the bottom plate 64 in the xz cross section. The configuration other than the shape of the fixed portion 52 may be the same as that of the cooling apparatus 10 in FIG. 3. Note that the width B1 of the edge portion 54 in the first direction (the x axis direction in the present example) may be a value as close as possible to 0. The width B1 may be 10% or less, or 5% or less of the width A1 or the width A2.

Since the fixed portion 52 of the side wall 63 has an arc shape, the inclination of the separated portion 56 in the vicinity of the edge portion 54 gradually changes as compared with the tapered shape. Therefore, as compared with the tapered shape, the distance between the separated portion 56 in the vicinity of the edge portion 54 and the bottom plate 64 becomes short, and the bonding between the separated portion 56 of the side wall 63 and the bottom plate 64 can be further strengthened. Note that, as described above, in the cooling fin 94, a space where the brazing material flows can be further secured between the separated portion 68 and the bottom plate 64.

Figure 5:
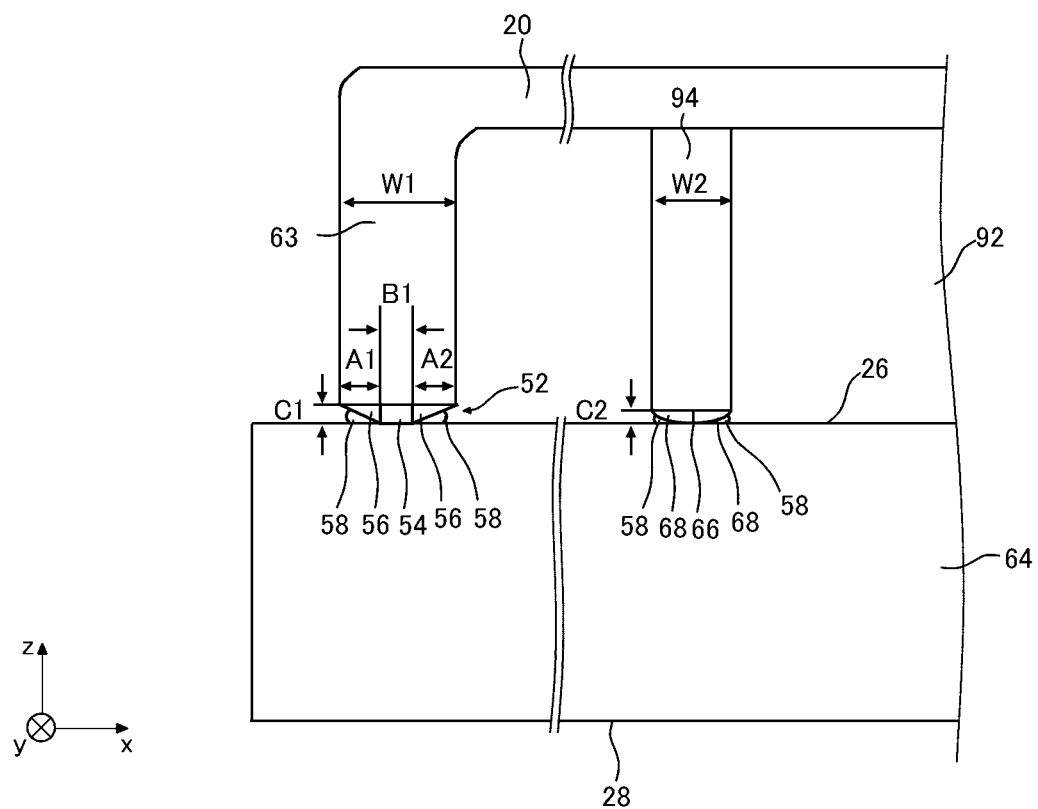
FIG. 5 is a diagram illustrating another example of the fixed portion 52 and the cooling fin 94 in the vicinity of the fixed portion 52 in the cooling apparatus 10.

FIG. 5 is a diagram illustrating another example of the fixed portion 52 and the cooling fin 94 in the vicinity of the fixed portion 52 in the cooling apparatus 10. The cooling apparatus 10 of FIG. 5 is different from the cooling apparatus 10 of FIG. 3 in that the edge of the cooling fin 94 has an arc shape in a predetermined cross section. The cooling fin 94 may have an arc shape protruding toward the bottom plate 64 in an arbitrary cross section perpendicular to the xy plane. The configuration other than the cooling fin 94 may be the same as that of the cooling apparatus 10 of FIG. 3.

Since the edge of the cooling fin 94 has an arc shape, the inclination of the separated portion 68 in the vicinity of the edge portion 66 gradually changes as compared with the tapered shape. Therefore, as compared with the tapered shape, the separated portion 68 in the vicinity of the edge portion 66 is closer to the bottom plate 64, and the bonding between the separated portion 68 and the bottom plate 64 can be further strengthened. As described above, in the fixed portion 52 of the side wall 63, a space in which the brazing material flows can be further secured between the separated portion 56 and the bottom plate 64.

Figure 6:
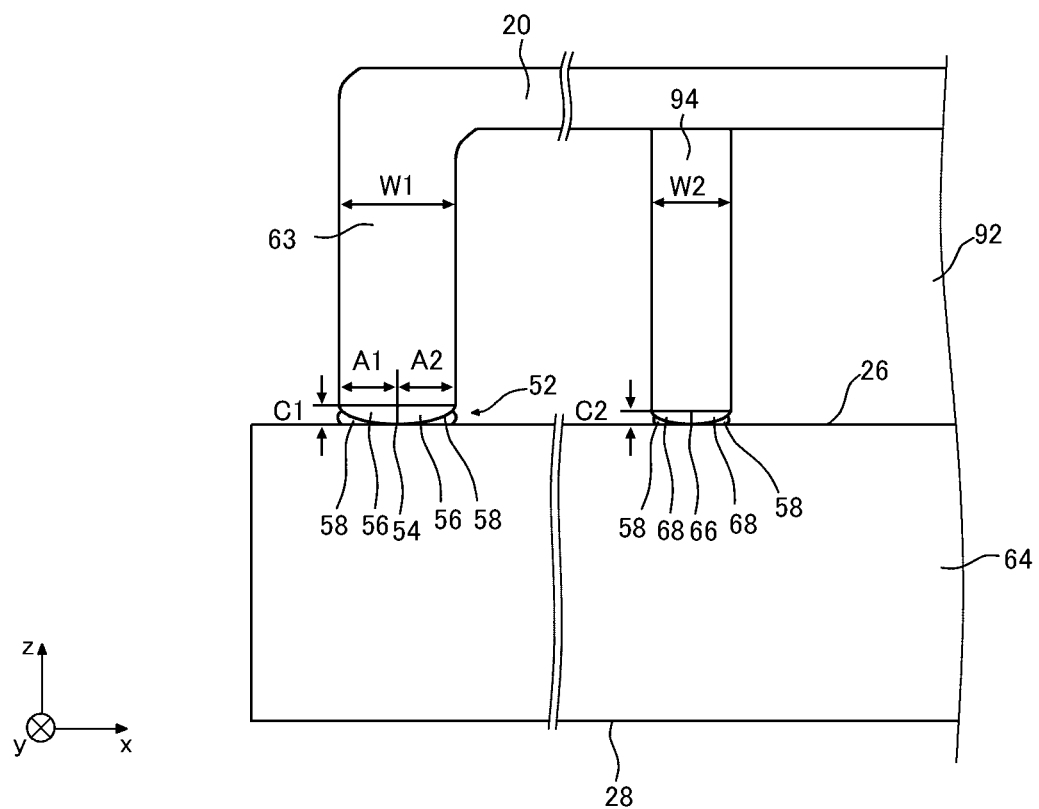
FIG. 6 is a diagram illustrating another example of the fixed portion 52 and the cooling fin 94 in the vicinity of the fixed portion 52 in the cooling apparatus 10.

FIG. 6 is a diagram illustrating another example of the fixed portion 52 and the cooling fin 94 in the vicinity of the fixed portion 52 in the cooling apparatus 10. The cooling apparatus 10 of FIG. 6 is different from the cooling apparatus 10 of FIG. 4 in that the edge of the cooling fin 94 has an arc shape. The configuration other than the cooling fin 94 may be the same as that of the cooling apparatus 10 in FIG. 4.

Figure 7:
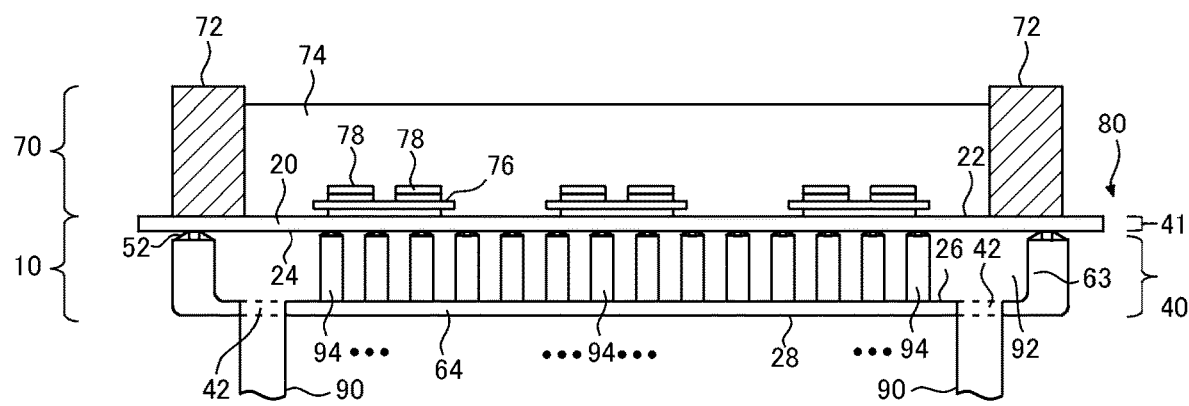
FIG. 7 is a schematic cross-sectional view illustrating an example of a semiconductor module 200 according to another embodiment of the present invention.
Figure 7:
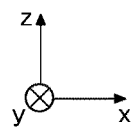

FIG. 7 is a schematic cross-sectional view illustrating an example of a semiconductor module 200 according to another embodiment of the present invention. The semiconductor module 200 of FIG. 7 is different from the semiconductor module 100 of FIG. 1 in the configurations of the ceiling portion 41 and the bottom portion 40. The configuration other than the ceiling portion 41 and the bottom portion 40 may be the same as that of the semiconductor module 100.

In the example of FIG. 7, the ceiling portion 41 includes the top plate 20. The bottom portion 40 includes the bottom plate 64, the side walls 63, and the cooling fins 94. The components of the ceiling portion 41 and the bottom portion 40 may be each integrally formed. That is, the bottom plate 64, the side walls 63, and the cooling fins 94 may be integrally formed.

The side wall 63 has the fixed portion 52. The side wall 63 may have the fixed portion 52 at the edge. In the example of FIG. 7, the fixed portion 52 is in close contact with the top plate 20 by a brazing material.

In the present example, as in FIG. 1, the fixed portion 52 has an edge portion and a separated portion. At least a part of the separated portion and the top plate 20 is disposed apart from each other, and thus the brazing material flowing in the separated portion bonds the side wall 63 and the top plate 20 without voids. Therefore, even when the configurations of the ceiling portion 41 and the bottom portion 40 are different, the sealing performance of the cooling apparatus 10 can be improved.

Figure 8:
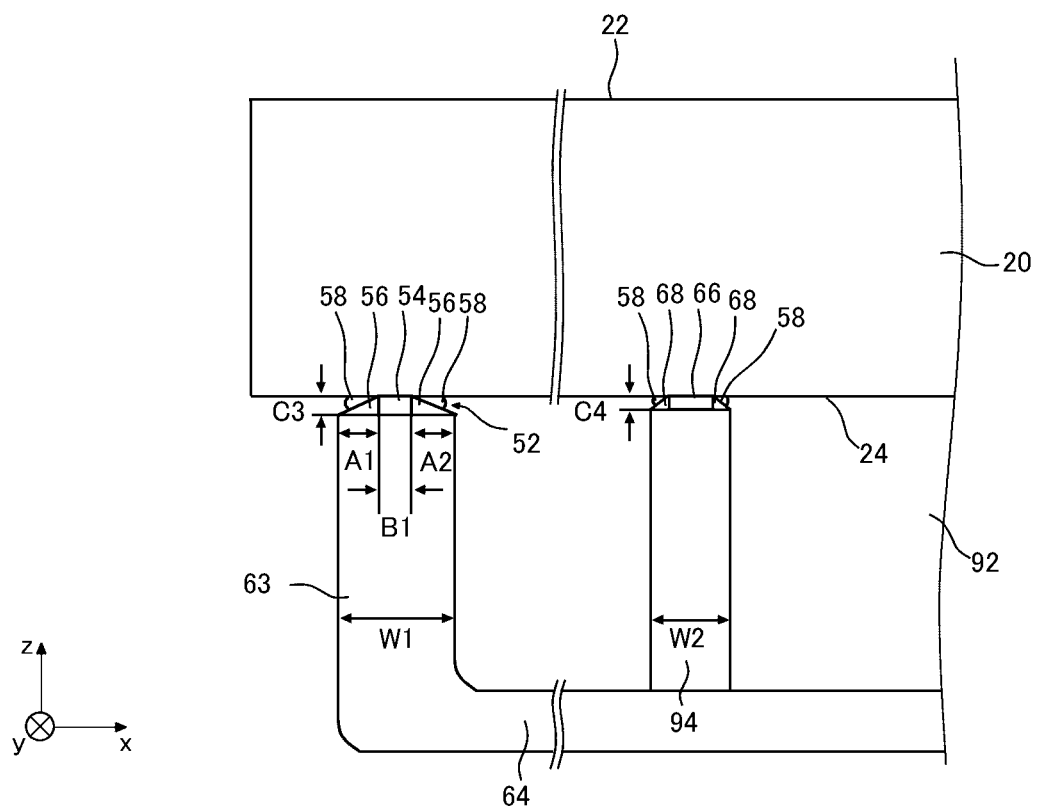
FIG. 8 is a diagram illustrating an example of a fixed portion 52 and a cooling fin 94 in the vicinity of the fixed portion 52 in the cooling apparatus 10 of FIG. 7.

FIG. 8 is a diagram illustrating an example of the fixed portion 52 and the cooling fin 94 in the vicinity of the fixed portion 52 in the cooling apparatus 10 in FIG. 7. In FIG. 8, reference numerals common to those in FIG. 3 are illustrated. In FIG. 8, the widths A1 and A2 of the separated portions 56, the width B1 of the edge portion 54, the width W1 of the side wall 63, and the width W2 of the cooling fin 94 may be the same as those in FIG. 3.

The brazing material 58 is disposed between the fixed portion 52 and the top plate 20. That is, the brazing material 58 may be disposed between the edge portion 54 and the top plate 20 or between the separated portion 56 and the top plate 20. The brazing material 58 bonds the fixed portion 52 and the top plate 20. In other words, the fixed portion 52 is brazed to the top plate 20. Since the fixed portion 52 has the edge portion 54 and the separated portion 56, the brazing material 58 can bond the separated portion 56 and the top plate 20 without voids. Therefore, the sealing performance of the cooling apparatus 10 can be improved.

The brazing material 58 is disposed between the edge of the cooling fin 94 and the top plate 20. That is, the brazing material 58 may be disposed between the edge portion 66 and the top plate 20 or between the separated portion 68 and the top plate 20. The brazing material 58 bonds the edge of the cooling fin 94 and the top plate 20. In other words, the edge of the cooling fin 94 is brazed to the top plate 20.

A maximum separation distance C4 between the edge of the cooling fin 94 and the lower surface 24 of the top plate 20 may be smaller than a maximum separation distance C3 between the separated portion 56 and the lower surface 24 of the top plate 20. The maximum separation distance C4 between the edge of the cooling fin 94 and the lower surface 24 of the top plate 20 may be the height of the edge portion 66. The maximum separation distance C3 between the separated portion 56 and the lower surface 24 of the top plate 20 may be the height of the edge portion 54. By setting the maximum separation distance C4 between the edge of the cooling fin 94 and the lower surface 24 of the top plate 20 to be smaller than the maximum separation distance C3 between the separated portion 56 and the lower surface 24 of the top plate 20, it is possible to ensure bonding property or load resistance also in the cooling fin 94 while improving the sealing performance of the cooling apparatus 10.

The maximum separation distance C3 may be smaller than the width of each of the plurality of separated portions 56 in the first direction. That is, the maximum separation distance C3 may be smaller than both the width A1 and the width A2 of the two separated portions 56 sandwiching the edge portion 54 in the first direction. The maximum separation distance C3 may be 0.1 mm or more, and preferably 0.2 mm or more. The maximum separation distance C3 may be 1.0 mm or less, and preferably 0.5 mm or less. The maximum separation distance C3 is 0.3 mm as an example. With such a configuration, it is possible to prevent the separated portion 56 and the lower surface 24 of the top plate 20 from being excessively separated from each other to deteriorate bonding property.

The maximum separation distance C4 may be 0.0 mm or more. The case where the maximum separation distance C4 is 0.0 mm means a case where the edge of the cooling fin 94 does not have a tapered shape. The maximum separation distance C4 may be 0.2 mm or less. The maximum separation distance C4 is 0.1 mm as an example.

Figure 9:
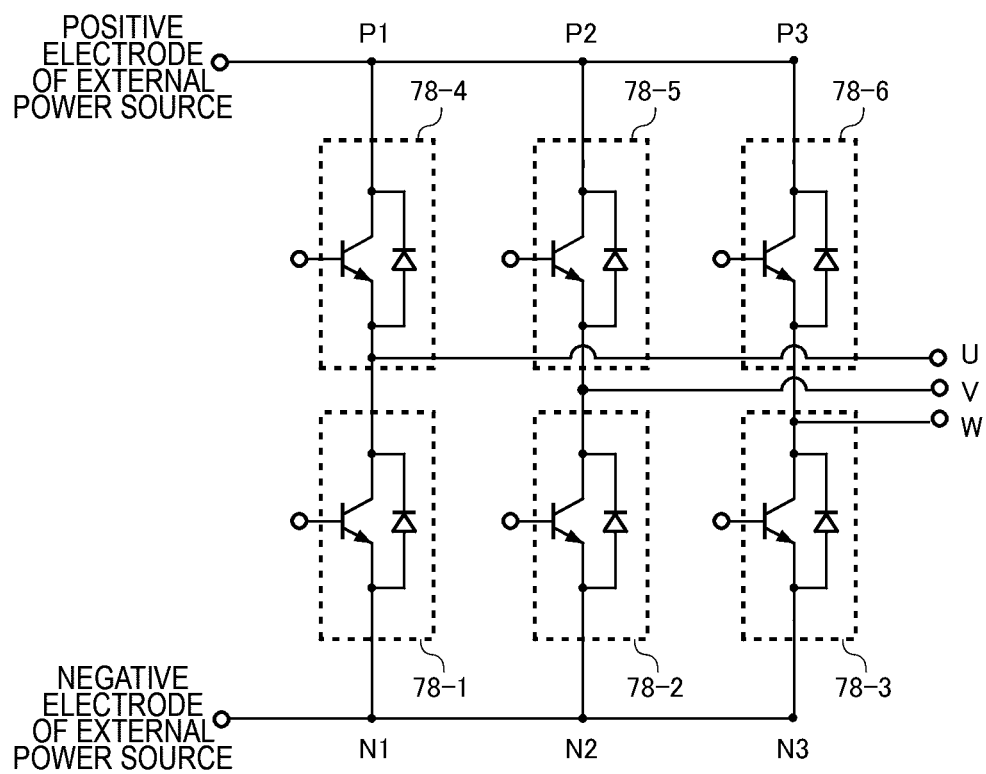
FIG. 9 is a main circuit diagram of the semiconductor module 100 according to one embodiment of the present invention.

FIG. 9 is a main circuit diagram of the semiconductor module 100 according to one embodiment of the present invention. The semiconductor module 100 may be a part of an in-vehicle unit that drives a motor of a vehicle. The semiconductor module 100 may function as a three-phase AC inverter circuit having output terminals U, V, and W.

Semiconductor chips 78-1, 78-2, and 78-3 may constitute lower arms in the semiconductor module 100, and a plurality of semiconductor chips 78-4, 78-5, and 78-6 may constitute upper arms in the semiconductor module 100. The set of semiconductor chips 78-1 and 78-4 may constitute a leg. The set of semiconductor chips 78-2 and 78-5 and the set of semiconductor chips 78-3 and 78-6 may similarly constitute legs. In the semiconductor chip 78-1, the emitter electrode may be electrically connected to an input terminal N1, and the collector electrode may be electrically connected to an output terminal U, respectively. In the semiconductor chip 78-4, the emitter electrode may be electrically connected to the output terminal U, and the collector electrode may be electrically connected to an input terminal P1, respectively. Similarly, in the semiconductor chips 78-2 and 78-3, the emitter electrode may be electrically connected to input terminals N2 and N3, respectively, and the collector electrode may be electrically connected to output terminals V and W, respectively. Further, in the semiconductor chips 78-5 and 78-6, the emitter electrode may be electrically connected to the output terminals V and W, respectively, and the collector electrode may be electrically connected to input terminals P2 and P3, respectively.

Each of the semiconductor chips 78-1 to 78-6 may be alternately switched by signals input to the control electrode pad of the semiconductor chip 78. In the present example, each semiconductor chip 78 may generate heat during switching. The input terminals P1, P2, and P3 may be connected to a positive electrode of an external power source, the input terminals N1, N2, and N3 may be connected to a negative electrode, and the output terminals U, V, and W may be connected to a load, respectively. The input terminals P1, P2, and P3 may be electrically connected to each other, and the other input terminals N1, N2, and N3 may also be electrically connected to each other.

In the semiconductor module 100, each of the plurality of semiconductor chips 78-1 to 78-6 may be an RC-IGBT (reverse conducting IGBT) semiconductor chip. In the RC-IGBT semiconductor chip, the IGBT and the freewheeling diode (FWD) may be integrally formed, and the IGBT and the FWD may be connected in antiparallel. Each of the plurality of semiconductor chips 78-1 to 78-6 may include a combination of a transistor such as a MOSFET or an IGBT and a diode. A chip substrate of the transistor and the diode may be a silicon substrate, a silicon carbide substrate, or a gallium nitride substrate.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

EXPLANATION OF REFERENCES

10: cooling apparatus
20: top plate
22: upper surface
24: lower surface
26: upper surface
28: lower surface
29: corner portion
36: shorter side
38: longer side
40: bottom portion
41: ceiling portion
42: opening
52: fixed portion
54: edge portion
56: separated portion
58: brazing material
62: outer edge portion
63: side wall
64: bottom plate
66: edge portion
68: separated portion
70: semiconductor device
72: housing portion
74: sealing member
76: circuit board
78: semiconductor chip
80: fastening portion
90: pipe
92: refrigerant circulation portion
94: cooling fin
100: semiconductor module
200: semiconductor module

What is claimed is:

1. A cooling apparatus for a semiconductor module including a semiconductor chip, the cooling apparatus comprising:
a top plate having a lower surface;
a bottom plate disposed to have a space between the bottom plate and the lower surface of the top plate, the space functioning as a refrigerant circulation portion;
a side wall configured to connect the top plate and the bottom plate and surround the refrigerant circulation portion; and
a cooling fin disposed in the refrigerant circulation portion and fixed to the top plate, wherein
the side wall includes a fixed portion provided for the top plate and fixed to the bottom plate,
the fixed portion includes:
an edge portion disposed to face the bottom plate; and
a separated portion adjacent to the edge portion in a first direction in which the refrigerant circulation portion and the side wall are aligned, the separated portion being disposed farther from the bottom plate disposed to face the edge portion than the edge portion
the fixed portion and the cooling fin are brazed to the bottom plate, and
a maximum separation distance between an edge of the cooling fin and an upper surface of the bottom plate is non-zero and smaller than a maximum separation distance between the separated portion and the upper surface of the bottom plate.

2. The cooling apparatus according to claim 1, wherein an edge of the cooling fin has a tapered shape or an arc shape.

3. The cooling apparatus according to claim 1, wherein the fixed portion has a tapered shape.

4. The cooling apparatus according to claim 1, wherein the fixed portion has an arc shape.

5. The cooling apparatus according to claim 1, wherein the fixed portion includes a plurality of the separated portions, and
the edge portion is sandwiched between the plurality of separated portions in the first direction.

6. The cooling apparatus according to claim 5, wherein a width of the edge portion in the first direction is smaller than a sum of widths of the plurality of separated portions in the first direction.

7. The cooling apparatus according to claim 6, wherein the width of the edge portion in the first direction is smaller than the width of each of the plurality of separated portions in the first direction.

8. The cooling apparatus according to claim 5, wherein a maximum separation distance between the separated portion of the fixed portion and an upper surface of the bottom plate is smaller than a width of each of the plurality of separated portions in the first direction.

9. The cooling apparatus according to claim 5, wherein a maximum separation distance between the separated portion of the fixed portion and an upper surface of the bottom plate is 0.1 mm or more and 1.0 mm or less.

10. The cooling apparatus according to claim 5, wherein a width of the edge portion in the first direction is one-fourth or less of a width of the side wall in the first direction.

11. The cooling apparatus according to claim 5, wherein the plurality of separated portions have a tapered shape in common or an arc shape in common.

12. The cooling apparatus according to claim 1, wherein the separated portion is a forged product.

13. The cooling apparatus according to claim 1, wherein the fixed portion is provided at a distal edge of the side wall.

14. The cooling apparatus according to claim 1, wherein an outer edge of the bottom plate disposed to face the edge portion is provided outside the side wall.

15. A semiconductor module comprising:
the cooling apparatus according to claim 1; and
a semiconductor device disposed above the top plate.

16. The cooling apparatus according to claim 1, wherein:
the fixed portion of the side wall is provided inside of a thickness of the side wall in a bottom view.

* * * * *